United States Patent
Loeliger et al.

(10) Patent No.: US 11,379,297 B2
(45) Date of Patent: Jul. 5, 2022

(54) SYSTEM AND METHOD TO PROVIDE SAFETY PARTITION FOR AUTOMOTIVE SYSTEM-ON-A-CHIP

(71) Applicant: NXP USA, Inc., Austin, TX (US)

(72) Inventors: Jeffrey Thomas Loeliger, Glasgow (GB); Derek Beattie, Glasgow (GB); Gordon Campbell, Glasgow (GB)

(73) Assignee: NXP USA, Inc., Austin, TX (US)

( * ) Notice: Subject to any disclaimer, the term of this patent is extended or adjusted under 35 U.S.C. 154(b) by 563 days.

(21) Appl. No.: 16/405,123

(22) Filed: May 7, 2019

(65) Prior Publication Data
US 2020/0356435 A1    Nov. 12, 2020

(51) Int. Cl.
*G06F 11/26* (2006.01)
*G06F 11/07* (2006.01)
(Continued)

(52) U.S. Cl.
CPC ............ *G06F 11/0796* (2013.01); *G06F 1/24* (2013.01); *G06F 11/0739* (2013.01);
(Continued)

(58) Field of Classification Search
CPC ............... G06F 11/079; G06F 11/0772; G06F 11/0796; G06F 11/0739; G06F 11/0751; G06F 11/362; G06F 11/2289; G06F 1/24; G01R 31/31857; G01R 31/318569; G01R 31/318536; G07C 5/0808; G01M 17/00
See application file for complete search history.

(56) References Cited

U.S. PATENT DOCUMENTS 7,627,784 B1 * 12/2009 Allen .................. G06F 11/3636
714/30
9,130,566 B1 * 9/2015 Ahmad ............ H03K 19/17764
(Continued)

FOREIGN PATENT DOCUMENTS

EP    WO 2016/030324 A1    3/2016
EP         3 153 970 A1     4/2017

OTHER PUBLICATIONS

Wikipedia's General-Purpose Input/Output historical version published Apr. 17, 2019 https://en.wikipedia.org/w/index.php?title=General-purpose_input/output&oldid=892890128 (Year: 2019).*

*Primary Examiner* — Joseph O Schell (57) ABSTRACT

An automotive control system includes a safety processor and a system-on-a-chip. The SoC includes a primary processor, a safety monitor, first and second GPIO banks, and a debug interface. The safety monitor is configured to detect a fault condition of the primary processor and to provide an indication of the fault condition to the safety processor. The first GPIO bank is coupled to the primary processor to provide input/output operations to a non-critical function of an automobile, while the second GPIO bank is coupled for a critical function of the automobile. The debug interface is coupled to the second GPIO bank to form a scan chain with input and output registers of the second GPIO bank, and is coupled to the safety processor to receive control information for the scan chain to provide input/output operations to the critical function of the automobile when the safety monitor provides the indication.

20 Claims, 7 Drawing Sheets

(51) Int. Cl.
*G06F 1/24* (2006.01)
*G06F 11/22* (2006.01)
*G06F 11/36* (2006.01)

(52) U.S. Cl.
CPC ...... *G06F 11/0751* (2013.01); *G06F 11/2289* (2013.01); *G06F 11/362* (2013.01)

(56) References Cited

U.S. PATENT DOCUMENTS

| | | | |
|---|---|---|---|
| 10,169,128 B1* | 1/2019 | Asnaashari | G06F 12/1054 |
| 2006/0041803 A1* | 2/2006 | Woodward | G01R 31/3177 |
| | | | 714/724 |
| 2011/0283141 A1* | 11/2011 | Lee | G06F 1/32 |
| | | | 714/30 |
| 2013/0080748 A1 | 3/2013 | Moyer et al. | |
| 2015/0241553 A1* | 8/2015 | Gehrels | G01S 7/4004 |
| | | | 342/173 |
| 2016/0070619 A1 | 3/2016 | Moran et al. | |
| 2017/0176530 A1* | 6/2017 | Cottrell | G01R 31/31719 |
| 2017/0277647 A1* | 9/2017 | Srivastava | G06F 13/4068 |
| 2018/0189156 A1 | 7/2018 | Hu et al. | |
| 2018/0285296 A1* | 10/2018 | Rota | G06F 13/4282 |
| 2020/0207469 A1* | 7/2020 | Benedict | B64C 37/00 |

\* cited by examiner

SYSTEM AND METHOD TO PROVIDE SAFETY PARTITION FOR AUTOMOTIVE SYSTEM-ON-A-CHIP

FIELD OF THE DISCLOSURE

This disclosure generally relates to information handling systems, and more particularly relates providing a safety partition for an automotive system-on-a-chip (SoC).

BACKGROUND

A modern automobile increasingly relies on electronic devices and systems to control the functions of the automobile. Such electronic devices and systems are utilized to control, manage, and maintain the basic functions of the automobile, such as acceleration, braking, steering, and exterior lighting. In addition, electronic devices and systems are relied upon to operate the more complex functions of the automobile, such as autonomous (driverless) operation, collision avoidance, adaptive cruise control, driver display, passenger infotainment, and passenger environment.

Each of the functions of the automobile that utilize electronic devices and systems is associated with a particular level of impact to the safety of the automobile and its occupants and cargo. For example, functions that relate to the comfort and entertainment of the passengers are deemed to be less critical than functions that relate to the movement of the automobile. Similarly, the functions of the head lamps, while more critical than passenger comfort and entertainment, are less critical than vehicle steering and braking. As such, the reliability demanded of the electronic devices and systems is dependent upon which functions the devices and systems control. Moreover, where a particular electronic device or system controls multiple functions, the reliability of that particular device or system will typically need to be ensured to the level of safety demanded by the most critical function that the particular device or system controls.

The electronic devices and systems that control various critical functions of an automobile are designed to ensure that the devices and systems are highly reliable in the first place, and to ensure that, should a failure occur, the failure is handled in a controlled fashion. That is, the electronic devices and systems are designed to be fault tolerant. One way to ensure the reliability and fault tolerance of electronic devices and systems is through redundancy. Redundancy may be provided on several overlapping levels. Hardware redundancy provides for multiple control devices for critical functions, so that if one control device fails, the other control devices continue controlling the critical functions. Information redundancy provides mechanisms to ensure that the data processed is valid data. Information redundancy may be provided by error detection and correction, or by the redundant data storage for critical data. Time redundancy provides for multiple iterations of a same operation to ensure that the aggregate result of the multiple iterations provide a valid result and to detect spurious instances of the operation.

A system-on-a-chip (SoC) is an integrated circuit or highly integrated system that incorporates many of the elements of a computer into a compact, low-power, low-cost element. The SoC typically provides for easily programmable control over a wide variety of input/output (I/O) devices, and thus is easily embedded into an automobile to provide the control of many of the functions of the automobile. Commonly available SoCs may include multiple processor cores, and so provide an inherent level of redundancy to control critical vehicle functions. As such, SoCs are emerging as a preferred design choice for the control, management, and maintenance of the functions in an automobile.

While providing certain levels of redundancy, a SoC may still be susceptible to failure modes that effect the entire SoC. For example, a power failure or electrostatic discharge (ESD) event may cause the failure of all of the processor cores of a SoC. Thus, there remains a need for more robust fault tolerance in an automotive control system that utilizes a SoC.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in association with this disclosure.

In an embodiment of the present disclosure, an automotive control system, includes a safety processor and a system-on-a-chip (SoC). The SoC includes a primary processor, a safety monitor, first and second general purpose input/output (GPIO) banks, and a debug interface. The safety monitor detects fault conditions of the primary processor and provides an indication of the fault condition to the safety processor. The first GPIO bank is coupled to the primary processor to provide input/output operations to a non-critical function of an automobile. The second GPIO bank is coupled to the primary processor to provide input/output operations to a first critical function of the automobile. The debug interface is coupled to the second GPIO bank to form a first scan chain with input and output registers of the second GPIO bank, and is coupled to the safety processor to receive first control information for the first scan chain to provide input/output operations to the first critical function of the automobile when the safety monitor provides the indication.

In a first case, the automotive control system further includes a primary voltage regulator and a safety voltage regulator. The primary voltage regulator coupled to provide power to the primary processor, the safety monitor, and the first GPIO bank. The safety voltage regulator is coupled to provide power to the safety processor, the debug interface, and the second GPIO bank. Here, the SoC may further include a watchdog module coupled to the safety voltage regulator, and coupled to receive the indication from the safety monitor. Further, the watchdog module may be configured to determine that the primary voltage regulator is not providing power, and in response to provide the indication to the safety processor.

In another case, the SoC further includes a third GPIO bank coupled to the primary processor to provide input/output operations to a second critical function of the automobile. Here, the debug interface is further coupled to the third GPIO bank to form a second scan chain with input and output registers of the third GPIO, and is further coupled to the safety processor to receive second control information for the second scan chain to provide input/output operations to the second critical function of the automobile when the safety monitor provides the indication.

In another case, the SoC further includes the safety processor.

In a final case, the first scan chain is a Joint Testing and Access Group (JTAG) scan chain. Here, the debug interface may be coupled to the safety processor via a Test Access Port (TAP).

In a second embodiment, a method is shown for providing control of automobile functions. The method includes coupling a primary processor of a system-on-a-chip (SoC) of an automotive control system to a first general purpose input/output (GPIO) bank of the SoC, and to a second GPIO bank of the SoC, wherein the first GPIO bank is associated with a non-critical function of an automobile and the second GPIO bank is associated with a first critical function of the automobile. The method further includes coupling a debug interface of the SoC to the second GPIO bank to form a first scan chain with input and output registers of the second GPIO bank, coupling the debug interface to a safety processor of the automotive control system to receive first control information for the first scan chain to provide input/output operations to the first critical function of the automobile, providing by the safety monitor an indication of the fault condition to the safety processor, and providing by the safety processor the first control information in response to receiving the indication.

In a first case, the method includes connecting a primary voltage regulator of the automotive control system to provide power to the primary processor, the safety monitor, and the first GPIO bank, and the method further includes connecting a safety voltage regulator of the automotive control system to provide power to the safety processor, the debug interface, and the second GPIO bank. Here, the method may include connecting a watchdog module of the SoC to the safety voltage regulator, and coupling the watchdog module to receive the indication from the safety monitor. Here further, the method may include determining, by the watchdog module, that the primary voltage regulator is not providing power, and providing, by the watchdog module, the indication to the safety processor in response to determining that the primary voltage regulator is not providing power.

In another case, the method includes coupling the primary processor to a third GPIO bank, wherein the third GPIO bank is associated with a second critical function of the automobile. Here the method further includes coupling the debug interface to the third GPIO bank to form a second scan chain with input and output registers of the third GPIO bank, coupling the debug interface to a safety processor of the automotive control system to further receive second control information for the second scan chain to provide input/output operations to the second first critical function of the automobile, and providing, by the safety processor, the second control information in response further to receiving the indication.

In another case, the SoC further includes the safety processor.

In a final case, the first scan chain is a Joint Testing and Access Group (JTAG) scan chain. Here, the debug interface may be coupled to the safety processor via a Test Access Port (TAP).

In an embodiment of the present disclosure, an automotive control system, includes a safety processor and a system-on-a-chip (SoC). The SoC includes a primary processor, a safety processor, a safety monitor, first and second general purpose input/output (GPIO) banks, and a multiplexor. The safety monitor detects fault conditions of the primary processor and provides an indication of the fault condition to the safety processor. The first GPIO bank is coupled to the primary processor to provide input/output operations to a non-critical function of an automobile. The second GPIO bank is coupled to the primary processor to provide input/output operations to a first critical function of the automobile. The multiplexor includes a first input coupled to the primary processor, a second input coupled to the safety processor, a selector input coupled to the safety processor, and an output coupled to the second GPIO bank. When the safety monitor provides the indication, the safety processor operates to assert a selector signal to the selector input and to provide input/output operations to the crucial function of the automobile.

In a particular case, the automotive control system further includes a primary voltage regulator and a safety voltage regulator. The primary voltage regulator coupled to provide power to the primary processor, the safety monitor, and the first GPIO bank. The safety voltage regulator is coupled to provide power to the safety processor, the multiplexor, and the second GPIO bank.

Figure 1:
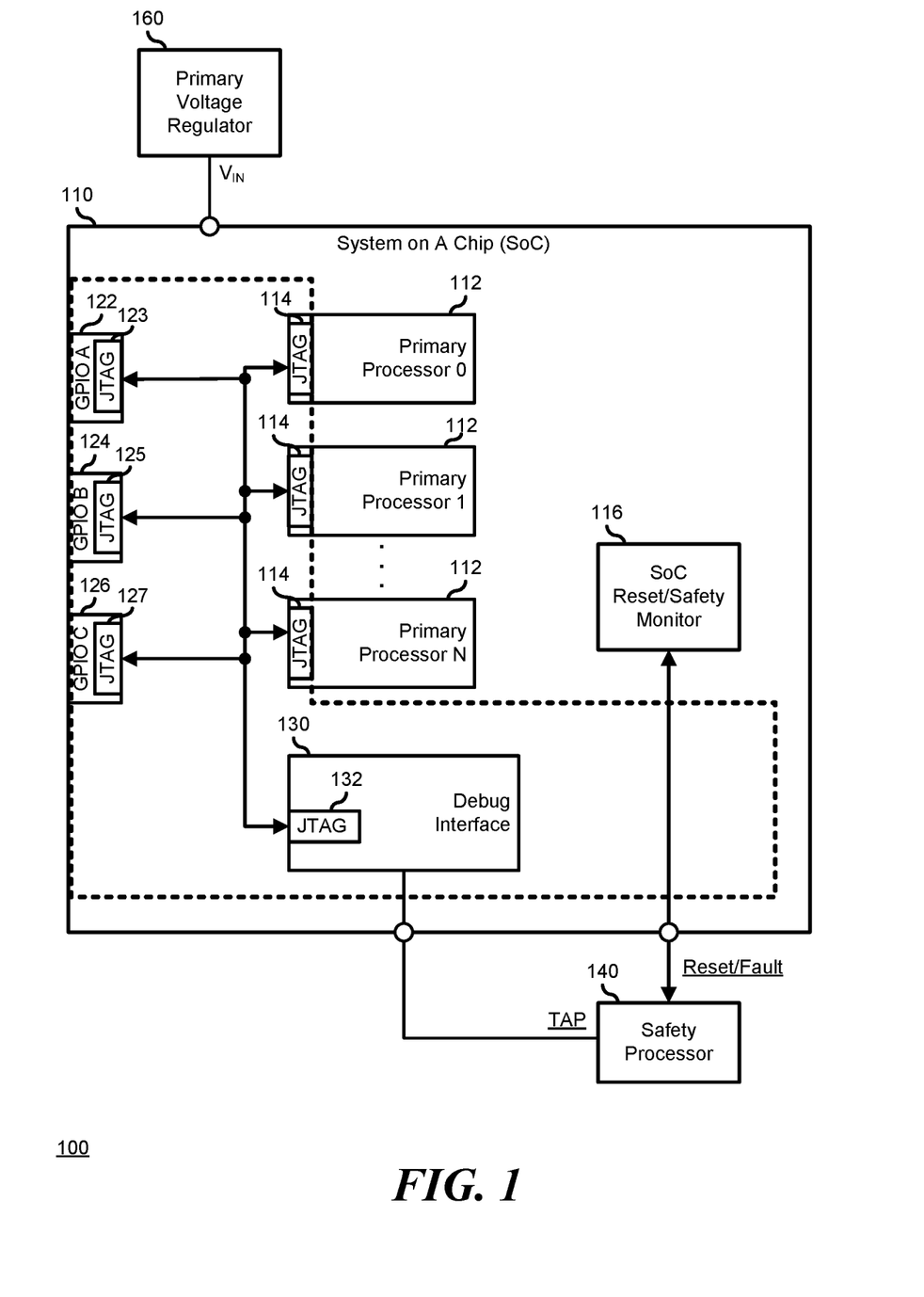
FIGS. 1-6 are block diagrams of automotive control systems including a system-on-a-chip (SoC) according to various embodiments of the present disclosure.

FIG. 1 illustrates an automotive control system 100 for use in an automobile (not shown). Automotive control system includes a system-on-a-chip (SoC) 110, a safety processor 140, and a primary voltage regulator 160. SoC 110 includes primary processors 112, a SoC reset and safety monitor 116, general purpose I/O (GPIO) banks 122, 124, and 126, and a debug interface 130. Automotive control system 100 represents an electronic system for the control, management, and maintenance of the functions of an automobile. The functions can include less critical functions, such as passenger comfort and entertainment functions, more critical functions, such as exterior lighting, and most critical functions, such as vehicle steering and braking.

SoC 110 receives power from primary voltage regulator 160 to power the elements of the SoC. Primary processors 112 execute machine-executable code receive information via GPIO banks 122, 124, and 126 related to the various functions, and to control the functions of the automobile based upon information provided to the automobile functions via the GPIO banks. As such, primary processors 112 and GPIO banks 122, 124, and 126 are in data communication with each other via various communication interfaces, not shown. GPIO bank 122 is exemplary of I/O devices configured to control less critical functions of the automobile. In a particular embodiment, GPIO bank 124 is exemplary of I/O devices configured to control functions of the automobile that are of intermediate criticality, while GPIO bank 126 is exemplary of I/O devices configured to control highly critical functions. In another embodiment, both of GPIO banks 124 and 126 are exemplary of I/O devices configured to control functions of the automobile that are highly critical, but GPIO bank 124 is utilized to control functions which need less frequent attention than the functions controlled by GPIO bank 126. The control of automobile functions by processors in a SoC via GPIO banks is known in the art and will not be further described herein, except as needed to illustrate the present embodiments.

Debug interface 130 includes a Joint Test Action Group (JTAG) interface 132, primary processors 112 each include a JTAG interface 114, GPIO bank 122 includes a JTAG interface 123, GPIO bank 124 includes a JTAG interface 125, and GPIO bank 126 includes a JTAG interface 127. JTAG interfaces 123, 125, 127, 132, and 114 are test and debug interfaces that are coupled together into one or more serially connected scan chains. In a typical SoC, the scan chains are utilized to load pre-determined test patterns into the scan elements of the SoC, to trigger logic operations on the test patterns to and to retrieve the resulting patterns from the scan elements of the SoC. The resulting patterns can be compared with expected results that should be retrieved if the logic elements of the SoC are working correctly, and failures to retrieve the expected results may be considered to be indications of logic failures within the SoC. The typical SoC thus may include a Test Access Port (TAP) to which test equipment can be connected. The test equipment then scans the pre-determined test patterns into the scan elements of the SoC, triggers the logic operations, and scans the resulting patterns out of the scan elements of the SoC. This is typically done during test phases in manufacturing, or for debug purposes when failures are observed in the SoC.

Here, safety processor 140 is connected to a TAP port of debug interface 130. When it is detected that primary processors 112 are unavailable for normal operation, safety processor 140 utilizes the TAP port of debug interface 130 to scan the scan chains established with JTAG interfaces 123, 125, 127, 132, and 114 to load the output registers associated with GPIO banks 122, 124, and 126 with command information associated with the automobile functions that are controlled thereby, to trigger the outputting of the command information by the GPIO banks, and to retrieve the resulting information associated with the automobile functions from the input registers associated with the GPIO banks. In this way, when primary processors 112 become unavailable for normal operation, safety processor 140 operates to control the functions of the automobile to safely handle the loss of the processing capabilities of the primary processors. Note that the connections between JTAG interfaces 114, 123, 125, 127, and 132 are not depicted as typical scan chains with the elements of the scan chain serially connected, but are depicted as in a bus-type interconnection in order to simplify the illustration, but it will be understood that the scan chains formed between the JTAG interfaces are provided in accordance with the practices as known in the art. It will be further understood that the scan chains include the input and output registers of GPIO banks 122, 124, and 126, in order for safety processor 130 to be maintain critical functions of the automobile. In a particular embodiment, safety processor 140 is powered by primary voltage regulator 160. In another embodiment, safety processor 140 is powered by a separate voltage regulator (not shown).

The safety operation of safety processor 140 is triggered by SoC reset/safety monitor 116. In a typical SoC, a reset and safety monitor operates to detect error conditions that effect the operations of the SoC, and, where possible, to redirect processing tasks between the processors. For example, if one of the processors of the SoC experiences a fault, such as a machine check, the reset/safety monitor can redirect the processing tasks from the failing processor to the other processors, reset the failing processor, and reallocate the processing tasks back to the reset processor. In another example, if all of the processors are unable to operate due to a global fault on the SoC, the reset/safety monitor can trigger a reboot of the SoC, and issue a fault/reset indication to the automobile. Here, SoC reset/safety monitor 116 operates to maintain the processing operations of primary processors 112 in so far is the primary processors are able to handle the reallocated load. However, when a fault impacts all of primary processors 112, SoC reset/safety monitor issues a fault/reset indication to safety processor 140, whereupon the safety processor proceeds to handle the critical functions of the automobile via debug commands to debug interface 130, as described above. Here, because safety processor 140 operates in the safety mode to control only those functions of the automobile that are the most safety critical, and does not necessarily control the less safety critical functions, the processing power of the safety processor can be considerably less than the processing power of primary processors 112. As such, the processing architecture implemented by automotive control system 100 is considered an asymmetric processing architecture. Here, automotive control system 100 is adaptable to existing SoCs that implement a debug architecture as shown by SoC 100, and the reliability of existing automotive control systems can be greatly enhanced by the addition of a secondary processor such as secondary processor 140, as shown and described above.

Figure 2:
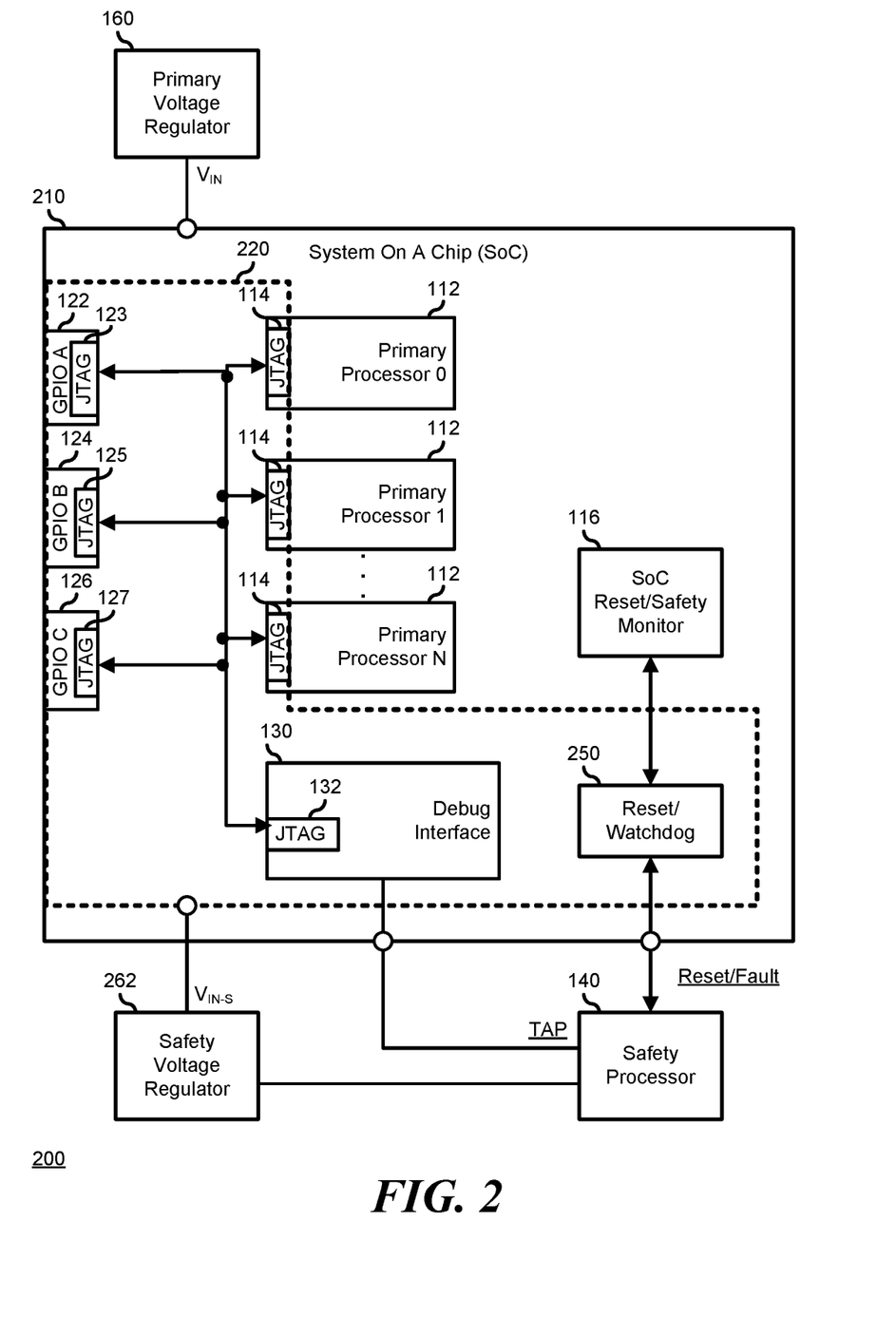

FIG. 2 illustrates another automotive control system 200, including a system-on-a-chip (SoC) 210, safety processor 140, primary voltage regulator 160, and a safety voltage regulator 262. SoC 210 includes primary processors 112, SoC reset and safety monitor 116, general purpose I/O (GPIO) banks 122, 124, and 126, debug interface 130, and a reset/watchdog module 250. Automotive control system 200 is similar to automotive control system 100, and where an element of automotive control system 200 includes the same reference numeral as was used for an element of automotive control system 100, the element of automotive control system 200 will be understood to have the same features and to perform the same functions as described above with respect to FIG. 1, unless otherwise noted. As such automotive control system 200 represents an electronic system for the control, management, and maintenance of the functions of an automobile.

Here, SoC 210 includes a safety power domain 220 that includes GPIO banks 122, 124, and 126, debug interface 130, JTAG interfaces 114, 123, 125, 127, and 132, and reset/watchdog module 150. Here, GPIO banks 122, 124, and 126, debug interface 130, JTAG interfaces 114, 123, 125, 127, and 132, and reset/watchdog module 250 (the elements within safety power domain 220), and safety processor 140 are powered separately by safety voltage regulator 262. Thus, the safety operations of automotive control system 200 are capable of being performed in a wider range of fault conditions than those capable of being performed by automotive control system 100. In particular, here, the elements within safety power domain 220 and safety processor 140, being powered separately from the other elements of SoC 210, will operate when the fault mode that precipitates the failure of primary processors 112 includes a total power loss form primary voltage regulator 160. Note that here, because existing scan chains in SoC 110 are utilized for the safety operations of safety processor 140, the scan operations performed by the safety processor will include the scanning of information into and out of JTAG interfaces 114. Here, the logic operations of primary processors 112 may not be valid due to the fault mode that precipitates the failure of the primary processors. For this reason, JTAG interfaces 114 are included within safety power domain 120 to ensure that the scan chains between the JTAG interfaces are in good operating state in all conditions.

The safety operation of safety processor 140 is triggered by reset/watchdog module 250, similarly to the way that the operation of safety processor 140 is triggered by SoC reset/safety monitor 116, as described above. In particular, SoC reset and safety monitor 216 operates to maintain the processing operations of primary processors 112 in so far is the primary processors are able to handle the reallocated load, and issues a fault/reset indication to reset/watchdog module 250 when a fault impacts all of the primary processors 112. Reset/watchdog module 250 forwards the fault/reset indication to safety processor 140, thereby triggering the operation of the safety processor. In addition, reset/watchdog module 250 provides a watchdog function, such that, if SoC reset and safety monitor 116 fails to provide a periodic refresh signal, the reset/watchdog module determines that SoC 220 is in a failure mode so sever that the SoC reset and safety monitor can not provide the periodic refresh signal. Here, when a watchdog timer of reset/watchdog module 250 times out, the reset/watchdog module provides a fault/reset indication to safety processor 140, thereby triggering the operation of the safety processor. As with automotive control system 100, automotive control system 200 implements an asymmetric processing architecture. In this case, automotive control system 200 is adaptable to SoCs that are modified to implement a safety power domain similar to safety power domain 220.

Figure 3:
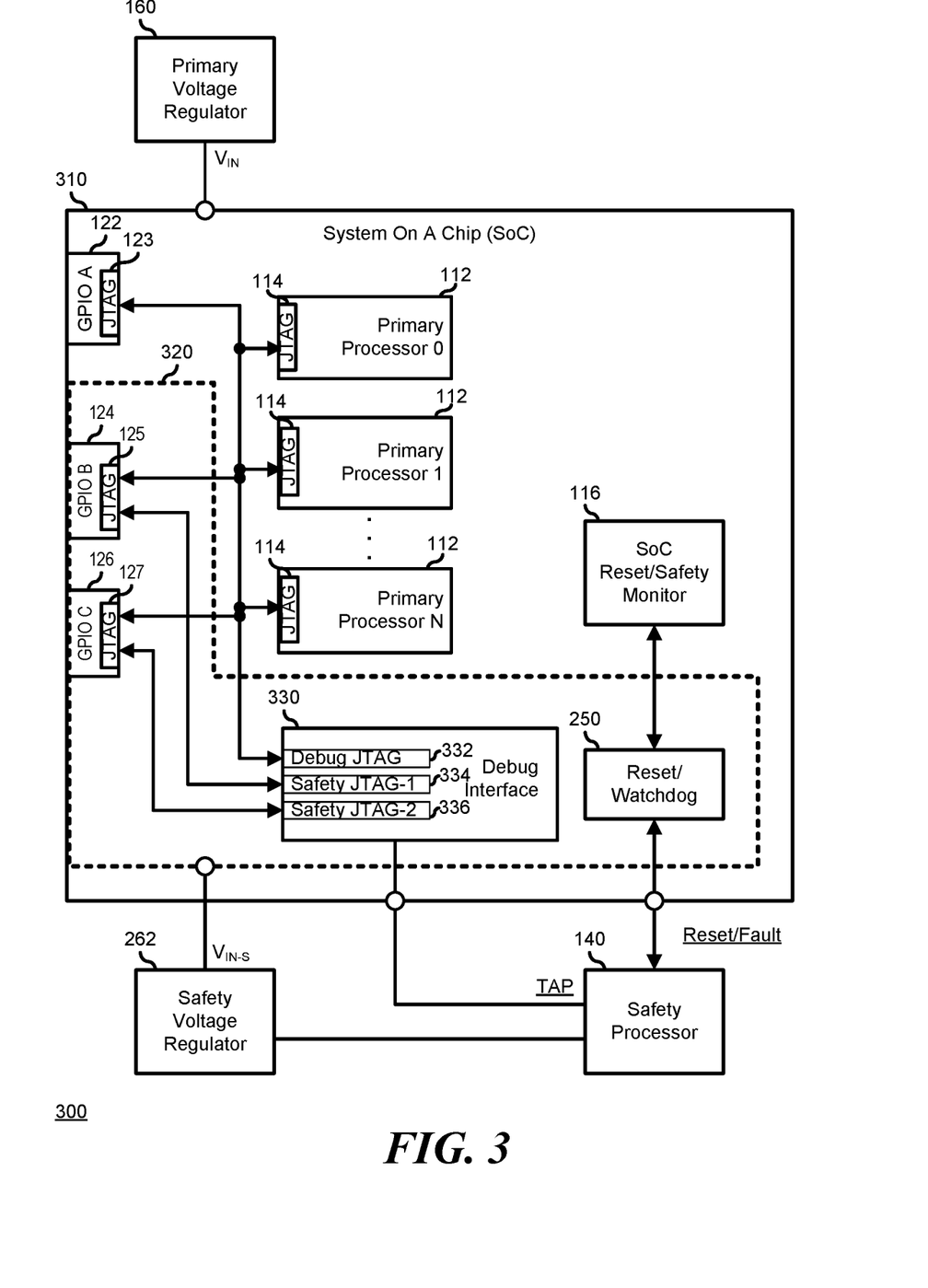

FIG. 3 illustrates another automotive control system 300, including a system-on-a-chip (SoC) 310, safety processor 140, primary voltage regulator 160, and safety voltage regulator 262. SoC 310 includes primary processors 112, SoC reset and safety monitor 116, general purpose I/O (GPIO) banks 122, 124, and 126, a debug interface 330, and reset/watchdog module 250. Automotive control system 300 is similar to automotive control systems 100 and 200, and represents an electronic system for the control, management, and maintenance of the functions of an automobile.

Here, SoC 310 includes a safety power domain 320 that includes GPIO banks 124 and 126, debug interface 330, JTAG interfaces 125, 127, and 132, and reset/watchdog module 250. Here, GPIO banks 122, 124, and 126, debug interface 130, JTAG interfaces 114, 123, 125, 127, and 132, and reset/watchdog module 150 (the elements within safety power domain 320), and safety processor 140 are powered separately by safety voltage regulator 262. Thus, the safety operations of automotive control system 200 are capable of being performed in a similar range of fault conditions than those capable of being performed by automotive control system 200. In particular, here, the elements within safety power domain 320 and safety processor 140, being powered separately from the other elements of SoC 310, will operate when the fault mode that precipitates the failure of primary processors 112 includes a total power loss form primary voltage regulator 160. Note that here, because existing scan chains in SoC 110 are utilized for the safety operations of safety processor 140, the scan operations performed by the safety processor will include the scanning of information into and out of JTAG interfaces 114.

Debug interface 330 includes a debug JTAG interface 332, a first safety JTAG interface 334, and a second safety JTAG interface 336. Debug JTAG interface 332 is connected to JTAG interfaces 114, 123, 125, and 127 into one or more scan chains as shown in SoCs 110 and 210, and as described above. Here, debug interface 330 operates in testing and debug by utilizing the scan chains associated with debug JTAG interface 332. First safety JTAG interface 334 is connected to from one or more scan chains in GPIO bank 124 via JTAG interface 125, and second safety JTAG interface 336 is connected to form one or more scan chains in GPIO bank 126 via JTAG interface 127.

The safety operation of safety processor 140 is triggered by reset/watchdog module 250, as shown in FIGS. 1 and 2, and as described above. However, here, when safety processor 140 operates in the safety mode, the safety processor selectively scans the scan chains associated with GPIO bank 124 and with GPIO bank 126 to control the associated functions. By splitting the scan chains associated with GPIO bank 124 from the scan chains associated with GPIO bank 126, SoC 310 permits a more efficient operation of safety processor 140. For example, where GPIO bank 124 is associated with critical functions that require less frequent attention than GPIO bank 126, safety processor 140 can more frequently access the scan chains associated with safety JTAG interface 336. In another example, where GPIO bank 124 is associated with less critical functions than GPIO bank 126, safety processor 140 can dedicate more processing power to the control of the functions associated with GPIO bank 126. As with automotive control systems 100 and 200, automotive control system 300 implements an asymmetric processing architecture. In this case, automotive control system 300 may more efficiently manage critical functions than automotive control system 200.

Figure 4:
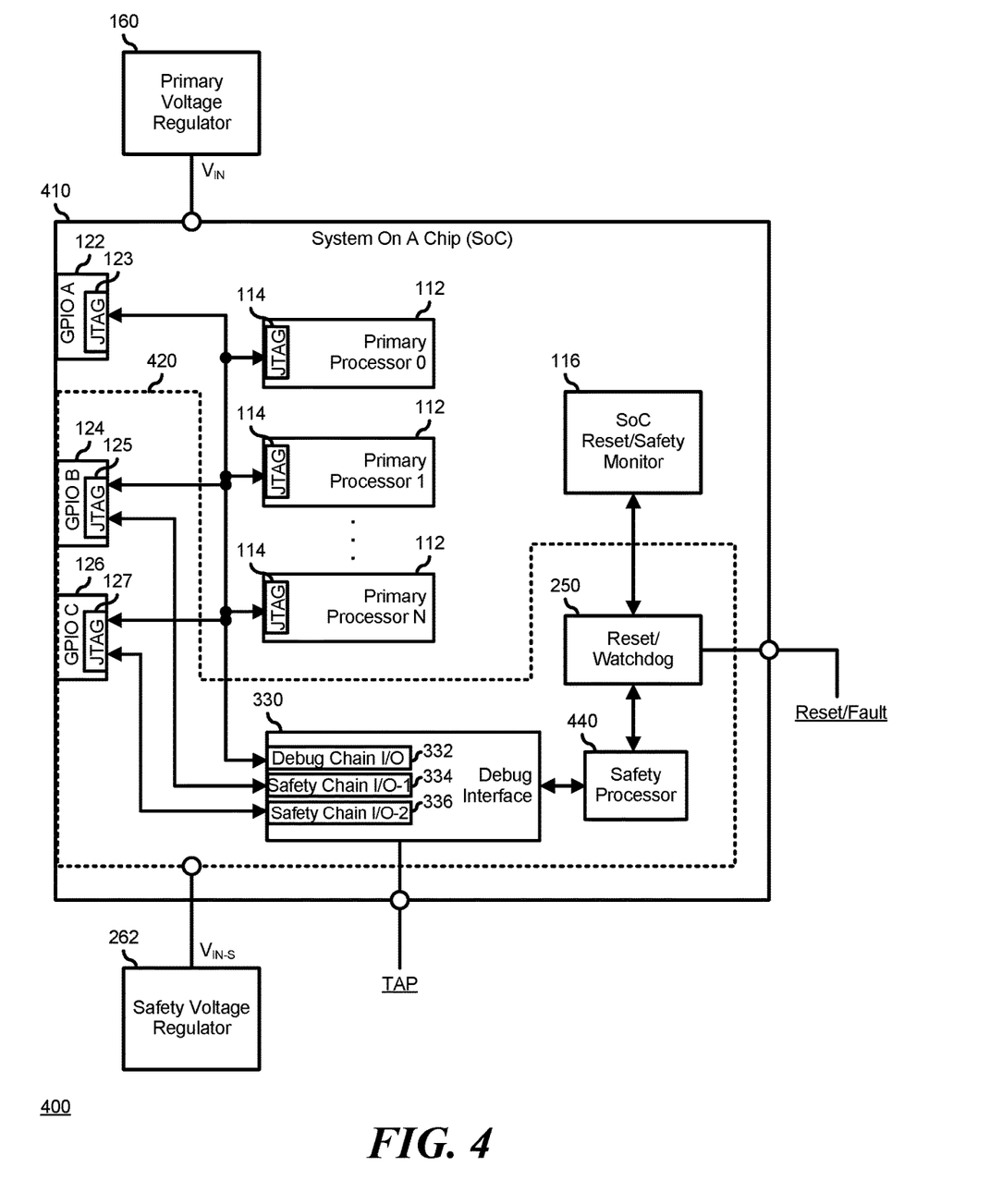

FIG. 4 illustrates another automotive control system 400, including a system-on-a-chip (SoC) 410, primary voltage regulator 160, and safety voltage regulator 262. SoC 410 includes primary processors 112, SoC reset and safety monitor 116, general purpose I/O (GPIO) banks 122, 124, and 126, a debug interface 330, a safety processor 440, and reset/watchdog module 250. Automotive control system 400 is similar to automotive control systems 100, 200, and 300, and represents an electronic system for the control, management, and maintenance of the functions of an automobile. Here, SoC 410 includes a safety power domain 420 that includes GPIO banks 122, 124 and 126, debug interface 330, JTAG interfaces 125, 127, and 123, safety processor 450, and reset/watchdog module 250. Automotive control system 400 operates in the same manner as automotive control system 300, except that automotive control system 400 dispenses with the separate safety processor 140 and integrates safety processor 440 into SoC 410.

Figure 5:
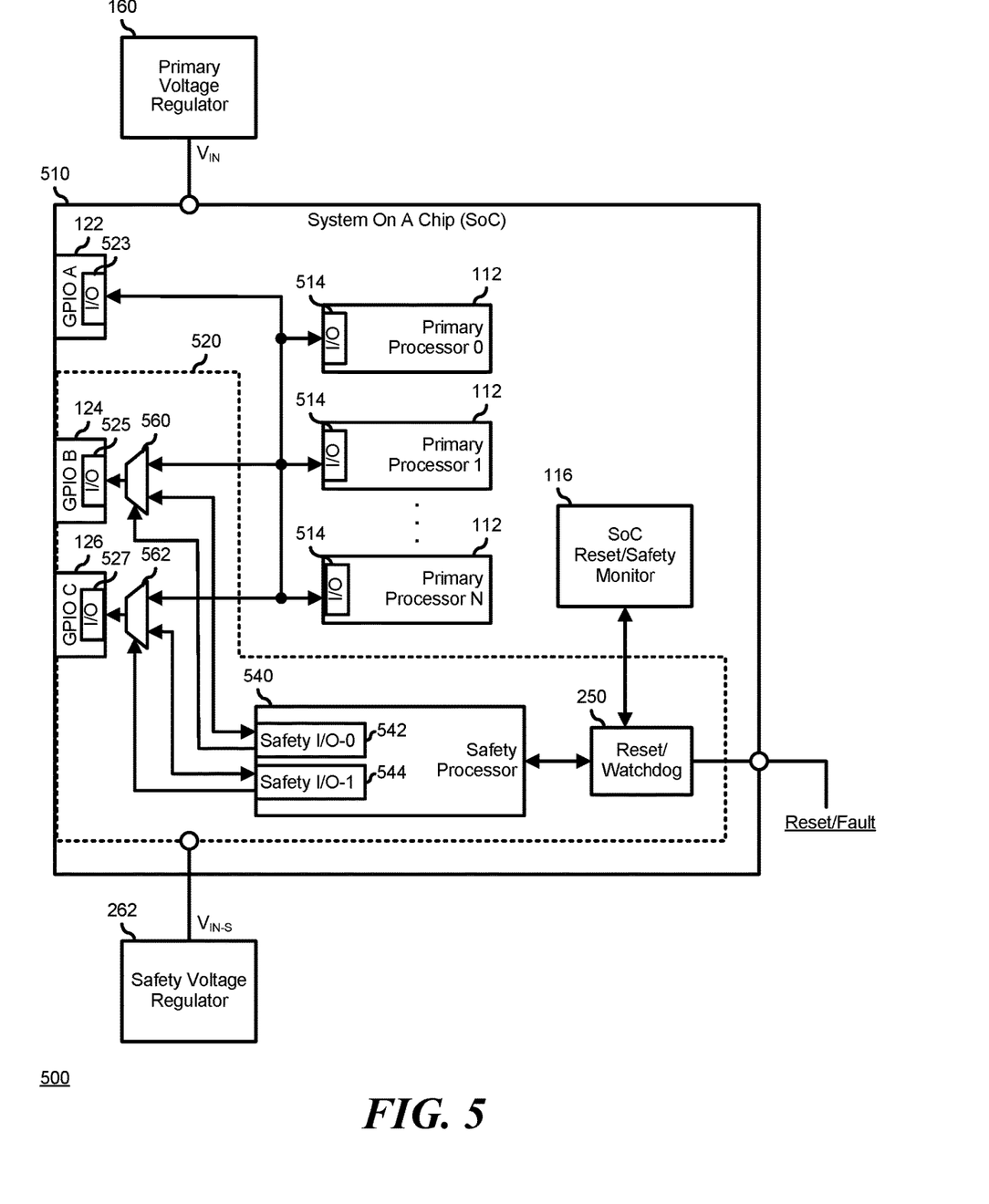

FIG. 5 illustrates another automotive control system 500, including a system-on-a-chip (SoC) 510, primary voltage regulator 160, and safety voltage regulator 262. SoC 510 includes primary processors 112, SoC reset and safety monitor 116, general purpose I/O (GPIO) banks 122, 124, and 126, multiplexors 560 and 562, a safety processor 540, and reset/watchdog module 250. Primary processors 112 each include an I/O interface 514. GPIO bank 122 includes an I/O interface 523, GPIO bank 124 includes an I/O interface 525, and GPIO bank 126 includes an I/O interface 527. Safety processor 540 includes I/O interfaces 542 and 544. In contrast to the depictions in 1-4, where connections between JTAG interfaces represented scan chains, here, I/O interfaces 514, 523, 525, 527, 542, and 544 represent data communication interfaces which may be bus-based data communication interfaces, serial-based data communication interfaces, or a combination thereof, as needed or desired.

I/O interfaces 514 are connected to I/O interface 523, to a first input of multiplexor 560, and to a first input of multiplexor 562. I/O interface 542 is connected to a second input of multiplexor 560, and I/O interface 544 is connected to a second input of multiplexor 562. An output of multiplexor 560 is connected to I/O interface 525, and an output of multiplexor 562 is connected to I/O interface 527. A selector output of I/O interface 542 is connected to a selector input of multiplexor 560, and a selector output of I/O interface 544 is connected to a selector input of multiplexor 562. Here, when the safety mode is triggered by reset/watchdog module 250, safety processor 540 asserts the selector outputs of I/O interfaces 542 and 544, and directly interacts with I/O interfaces 525 and 527 via respective multiplexors 560 and 562.

Figure 6:
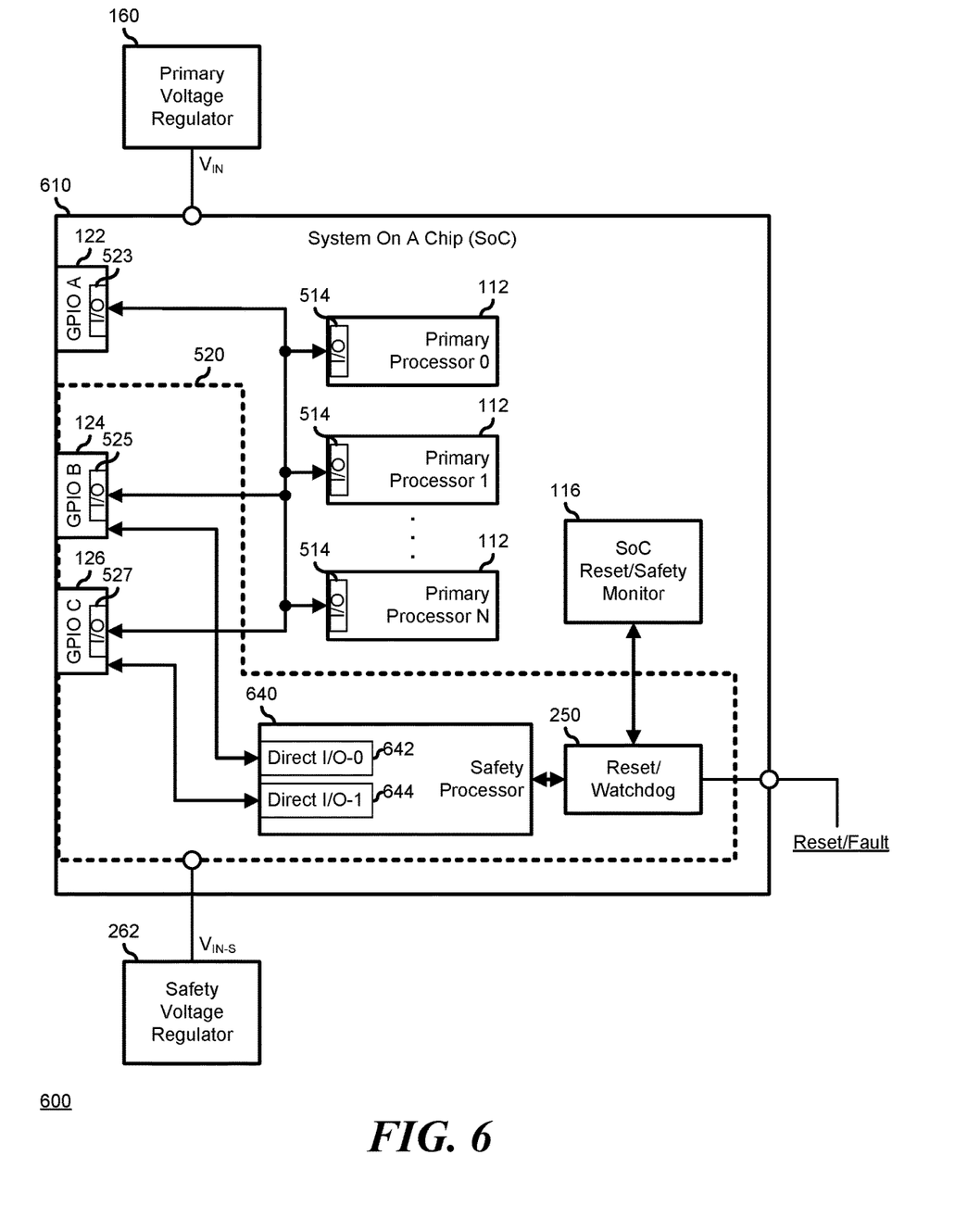

FIG. 6 illustrates another automotive control system 600, including a system-on-a-chip (SoC) 610, primary voltage regulator 160, and safety voltage regulator 262. SoC 610 includes primary processors 112, SoC reset and safety monitor 116, general purpose I/O (GPIO) banks 122, 124, and 126, multiplexors 560 and 562, a safety processor 640, and reset/watchdog module 250. Primary processors 112 each include an I/O interface 514. GPIO bank 122 includes an I/O interface 523, GPIO bank 124 includes an I/O interface 525, and GPIO bank 126 includes an I/O interface 527. Safety processor 640 includes direct I/O interfaces 642 and 644. I/O interfaces 514 are connected to I/O interfaces 523, 525, and 527. Here, direct I/O interface 642 is connected directly to GPIO bank 525, and direct I/O interface 644 is connected directly to GPIO bank 527. Here, because safety processor 640 is integrated into SoC 610, the connection between the safety processor and the critical I/O can be designed into the SoC, such that, when in the safety mode, the safety processor can directly access the input and output registers of the critical automotive functions, as needed or desired. The direct connection may represent a serial communication link, similar to a JTAG interface, but may represent a proprietary interface as needed or desired.

Figure 7:
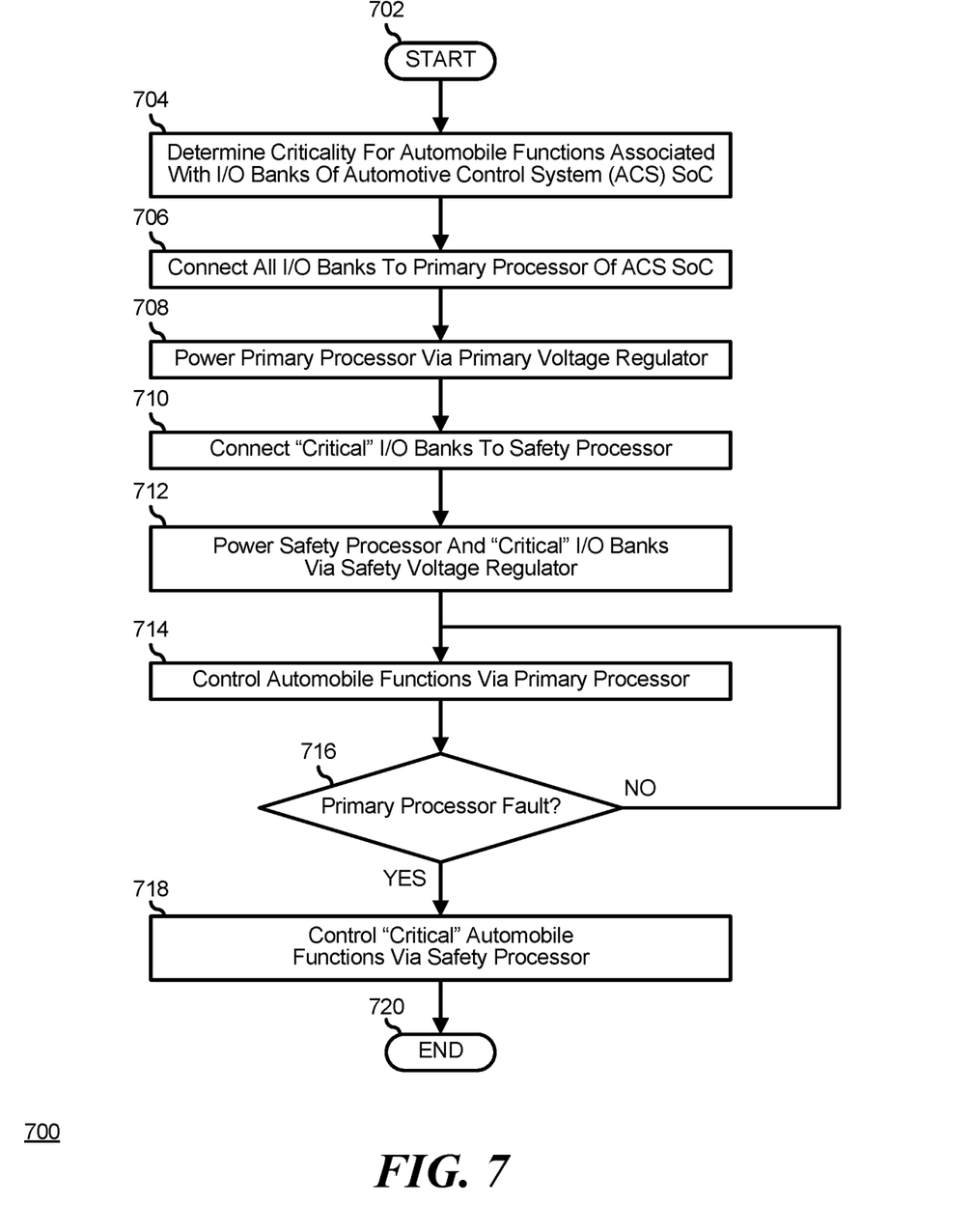
FIG. 7 is a flowchart illustrating a method for controlling automobile functions via an automotive control system according to an embodiment of the present disclosure.

FIG. 7 illustrates a method 700 for controlling automobile functions via an automotive control system. The automotive control system can include a system-on-a-chip (SoC) that integrates one or more primary processor and I/O blocks. The I/O blocks can include inputs and outputs whereby the primary processor operates to control the functions of the automobile. The method starts at block 702. A criticality level is determined for each automobile function that is controlled by the automotive control system in block 704. Here, a particular level of impact to the safety of the automobile and its occupants and cargo is associated with each automobile function. All of the I/O banks of the SoC are communicatively connected to the primary processor in block 706. Here, the primary processor receives information from the inputs of the I/O banks from sensors associated with the automobile functions, and the primary processor provides information to the outputs of the I/O banks to control the functions of the automobile.

The primary processor and the I/O banks associated with non-critical functions of the automobile are powered by a primary voltage regulator of the automotive control system in block 708. The I/O banks associated with the critical automobile functions are connected to a safety processor in block 710. The connection between the I/O banks associated with the critical automobile functions and the safety processor may include a scan chain connections, direct serial connections, or other connections as needed or desired. The safety processor and the I/O banks associated with the critical automobile functions are powered by a safety voltage regulator in block 712. The I/O banks associated with the critical automobile functions may also be powered by the primary voltage regulator as needed or desired. Here, the power to the automotive control system can be configures such that, in normal operation the automotive control system receives power from the primary voltage regulator, and when a safety mode of operation is entered, the safety voltage regulator takes over powering the I/O banks associated with the critical automobile functions. In a particular embodiment, the safety voltage regulator may be associated with a power supply that is provided for testing and debug of the SoC.

The primary processor controls the automobile functions through the I/O banks in block 714. A decision is made as to whether or not the primary processor is experiencing a fault condition in decision block 716. If not, the "NO" branch of decision block 716 is taken and the method returns to block 714 where the primary processor controls the automobile functions through the I/O banks. If the primary processor is experiencing a fault condition, the "YES" branch of decision block 716 is taken, the safety processor begins to control the critical automobile functions through the I/O banks associated with the critical automobile functions in block 718, and the method ends in block 720.

For purpose of this disclosure, automotive control systems and SoCs are representative of any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an automotive control system or a SoC can include a device that integrates all or substantially all of the components typically associated with a computer system or other electronic system, such as a data processing element for executing machine-executable code (e.g., a central processing unit (CPU), a microprocessor unit (MPU), or another type of data processing element), a memory element (e.g., a random-access memory (RAM) element, a non-volatile memory element, or another type of memory element), input/output (I/O) ports, power conditioning elements, and the like. An automotive control system or a SoC may further include elements for analog signal processing or mixed signal (combined analog and digital) processing. A SoC may represent a single integrated circuit device, or may represent a circuit board that includes additional functions and features. For example, where a single integrated circuit device includes a power supply circuit, a circuit board that includes the integrated circuit device may be provided with bulk capacitors that are integrated onto the circuit board. Other elements, such as various power and data connectors may also be integrated onto the circuit board. While the present embodiments are represented utilizing a SoC, the teachings of the present disclosure are not limited to applications utilizing SoCs, but may likewise be applicable in various types of systems, with varying levels of system integration and processing power, such as a computer system or consumer electronic device, a network system, or any other suitable device and may vary in size, shape, performance, functionality, and price, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

In this disclosure, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

What is claimed is:

1. An automotive control system, comprising:
    a safety processor; and
    a system-on-a-chip (SoC), including:
        a primary processor;
        a safety monitor configured to detect a fault condition of the primary processor and to provide an indication of the fault condition to the safety processor;
        a first general purpose input/output (GPIO) bank coupled to the primary processor for communication to control a non-critical function of an automobile;
        a second GPIO bank coupled to the primary processor for communication to control a first critical function of the automobile; and
        a debug interface coupled to the second GPIO bank to form a first scan chain with input and output registers of the second GPIO bank, the debug interface coupled to the safety processor to receive first control information for the first scan chain to control the first critical function of the automobile based on the indication of the fault condition.

2. The automotive control system of claim 1, further comprising:
    a primary voltage regulator coupled to provide power to the primary processor, the safety monitor, and the first GPIO bank; and
    a safety voltage regulator coupled to provide power to the safety processor, the debug interface, and the second GPIO bank.

3. The automotive control system of claim 2, wherein the SoC further includes a watchdog module coupled to the safety voltage regulator, and coupled to receive the indication from the safety monitor.

4. The automotive control system of claim 3, wherein the watchdog module is configured to determine that the primary voltage regulator is not providing power, and in response to provide the indication to the safety processor.

5. The automotive control system of claim 1, wherein:
    the SoC further includes a third GPIO bank coupled to the primary processor to provide input/output operations to a second critical function of the automobile, and
    the debug interface is further coupled to the third GPIO bank to form a second scan chain with input and output registers of the third GPIO bank, and is further coupled to the safety processor to receive second control information for the second scan chain to provide input/output operations to the second critical function of the automobile when the safety monitor provides the indication.

6. The automotive control system of claim 1, wherein the SoC further includes the safety processor.

7. The automotive control system of claim 1, wherein the first scan chain is a Joint Testing and Access Group (JTAG) scan chain.

8. The automotive control system of claim 1, wherein the debug interface is coupled to the safety processor via a Test Access Port (TAP).

9. A method for providing control of automobile functions, the method comprising:
    coupling a primary processor of a system-on-a-chip (SoC) of an automotive control system to a first general purpose input/output (GPIO) bank of the SoC, and to a second GPIO bank of the SoC, wherein the first GPIO bank is associated with a non-critical function of an automobile and the second GPIO bank is associated with a first critical function of the automobile;
    coupling a debug interface of the SoC to the second GPIO bank to form a first scan chain with input and output registers of the second GPIO bank;
    coupling the debug interface to a safety processor of the automotive control system to receive first control information for the first scan chain to control the first critical function of the automobile;
    providing, by the safety monitor, an indication of the fault condition to the safety processor; and
    providing, by the safety processor, the first control information in response to receiving the indication.

10. The method of claim 9, further comprising:
    connecting a primary voltage regulator of the automotive control system to provide power to the primary processor, the safety monitor, and the first GPIO bank; and
    connecting a safety voltage regulator of the automotive control system to provide power to the safety processor, the debug interface, and the second GPIO bank.

11. The method of claim 10, further comprising:
    connecting a watchdog module of the SoC to the safety voltage regulator; and
    coupling the watchdog module to receive the indication from the safety monitor.

12. The method of claim 11, further comprising:
    determining, by the watchdog module, that the primary voltage regulator is not providing power; and
    providing, by the watchdog module, the indication to the safety processor in response to determining that the primary voltage regulator is not providing power.

13. The method of claim 9, further comprising:
    coupling the primary processor to a third GPIO bank, wherein the third GPIO bank is associated with a second critical function of the automobile;
    coupling the debug interface to the third GPIO bank to form a second scan chain with input and output registers of the third GPIO bank;
    coupling the debug interface to the safety processor of the automotive control system to further receive second control information for the second scan chain to control the second critical function of the automobile; and
    providing, by the safety processor of the automotive control system, the second control information in response further to receiving the indication.

14. The method of claim 9, wherein the SoC further includes the safety processor.

15. The method of claim 9, wherein the first scan chain is a Joint Testing and Access Group (JTAG) scan chain.

16. The method of claim 9, wherein the debug interface is coupled to the safety processor via a Test Access Port (TAP).

17. An automotive control system, comprising:
a system-on-a-chip (SoC), including:
- a primary processor;
- a safety processor;
- a safety monitor configured to detect a fault condition of the primary processor and to provide an indication of the fault condition to the safety processor;
- a first general purpose input/output (GPIO) bank for communication to control a non-critical function of an automobile, the first GPIO bank coupled to the primary processor;
- a second GPIO bank for communication to control a critical function of the automobile; and
- a multiplexor including a first input coupled to the primary processor, a second input coupled to the safety processor, a selector input coupled to the safety processor, and an output coupled to the second GPIO bank, wherein, based on the indication, the safety processor is configured to assert a selector signal to the selector input and to provide input/output operations to the critical function of the automobile.

18. The automotive control system of claim 17, further comprising:
- a primary voltage regulator coupled to provide power to the primary processor, the safety monitor, and the first GPIO bank; and
- a safety voltage regulator coupled to provide power to the safety processor, the multiplexor, and the second GPIO bank.

19. The automotive control system of claim 18, wherein the SoC further includes a watchdog module coupled to the safety voltage regulator, and configured to receive the indication from the safety monitor.

20. The automotive control system of claim 19, wherein the watchdog module is configured to determine that the primary voltage regulator is not providing power, and in response, provide the indication to the safety processor.

\* \* \* \* \*